United States Patent [19]

Yang et al.

[11] Patent Number: 6,071,597
[45] Date of Patent: Jun. 6, 2000

[54] FLEXIBLE CIRCUITS AND CARRIERS AND PROCESS FOR MANUFACTURE

[75] Inventors: Rui Yang, Austin, Tex.; Thach G. Truong, Columbia, Mo.; Justine A. Mooney, Austin, Tex.; Moses M. David, Woodbury, Minn.

[73] Assignee: 3M Innovative Properties Company, St. Paul, Minn.

[21] Appl. No.: 08/919,883

[22] Filed: Aug. 28, 1997

[51] Int. Cl.[7] .................................................. B32B 9/00
[52] U.S. Cl. ........................ 428/209; 428/408; 428/458; 174/254; 174/258
[58] Field of Search .................................. 257/646, 758, 257/774; 174/254, 258; 428/408, 458, 477.4, 209

[56] References Cited

U.S. PATENT DOCUMENTS

| | | | |
|---|---|---|---|
| 4,231,154 | 11/1980 | Gazdik et al. | 29/840 |
| 4,383,728 | 5/1983 | Litington | 350/1.7 |
| 4,400,410 | 8/1983 | Green et al. | 427/39 |
| 4,480,288 | 10/1984 | Gazdik et al. | 361/398 |
| 4,504,410 | 3/1985 | Hempel et al. | 252/358 |
| 4,634,648 | 1/1987 | Jansen et al. | 430/84 |
| 4,643,948 | 2/1987 | Diaz et al. | 428/422 |
| 4,661,409 | 4/1987 | Kieser et al. | 428/408 |
| 4,698,256 | 10/1987 | Giglia et al. | 428/216 |
| 4,746,538 | 5/1988 | Mackowski | 427/38 |
| 4,756,964 | 7/1988 | Kincaid et al. | 428/408 |
| 4,809,876 | 3/1989 | Tomaswick et al. | 220/458 |
| 4,914,551 | 4/1990 | Anschel et al. | 361/389 |
| 4,937,707 | 6/1990 | McBride et al. | 361/398 |
| 5,039,358 | 8/1991 | Birkle et al. | 148/33.3 |
| 5,073,785 | 12/1991 | Jansen et al. | 346/1.1 |
| 5,153,753 | 10/1992 | Ohta et al. | 428/408 |
| 5,196,907 | 3/1993 | Birkle et al. | 257/289 |
| 5,227,008 | 7/1993 | Klun et al. | 156/630 |
| 5,401,913 | 3/1995 | Gerber et al. | 174/264 |
| 5,508,071 | 4/1996 | Banholzer et al. | 428/34.4 |
| 5,508,092 | 4/1996 | Kimock et al. | 428/216 |
| 5,559,367 | 9/1996 | Cohen et al. | 257/77 |
| 5,559,540 | 9/1996 | Burolla | 347/45 |
| 5,576,925 | 11/1996 | Gorowitz et al. | 361/301.2 |
| 5,631,087 | 5/1997 | Fukuda et al. | 428/408 |
| 5,635,254 | 6/1997 | Holcombe et al. | 427/450 |
| 5,784,201 | 7/1998 | Lee et al. | 359/582 |

FOREIGN PATENT DOCUMENTS

| | | | |
|---|---|---|---|
| 0064343A2 | 7/1995 | European Pat. Off. | C23C 16/02 |
| 02046526 | 2/1990 | Japan | G11B 5/82 |
| 2-223451 | 9/1990 | Japan | B41J 3/04 |
| 07118853 | 5/1995 | Japan | C23C 16/26 |
| 2287473 | 9/1995 | United Kingdom | A61L 29/00 |

OTHER PUBLICATIONS

"Plasma deposition of hydrogenated amorphous carbon; growth rates, properties & structures", N.Fourches & G. Turban, *Thin Solid Films*, 240 (1994), pp. 28–38.

"Effect of diluent gases added during deposition on the etching characteristics of diamond–like carbon films", J.Seth, R.Padiyath & S.Babu, *Thin Solid Films*, 212 (1994), pp. 251–255.

"Compilation of Diamond–Like Carbon Properties for Barriers and Hard Coatings", D.Outka et al, Sandia Nat'l Labs. Rel. #SAND94–8219 (1994).

"Structure and Electronic Properties of Diamond–Like Carbon", J.Robertson, *Diamond and Diamond–Like Carbon Films*, NATO Advanced Study Institute, Pisa (1990).

*Primary Examiner*—Cathy Lam
*Attorney, Agent, or Firm*—Darla P. Fonseca

[57] ABSTRACT

A flexible circuit carrier including at least one layer of polymer dielectric material, at least one layer of conductive material thereover, each layer having two major surfaces, at least one of said layers having at least one aperture therein, wherein at least one layer has a material coated on at least a portion thereof having a Young's Modulus of from about 100 to about 200 GPa, a dielectric constant (between 45 MHz and 20 GHz) of from about 8 to about 12, and a Vickers hardness of from about 2000 to about 9000 kg/mm$^2$.

14 Claims, 6 Drawing Sheets

FLEXIBLE CIRCUITS AND CARRIERS AND PROCESS FOR MANUFACTURE

FIELD OF THE INVENTION

The invention relates to flexible circuits and carriers for flexible circuits made therefrom which are coated, either selectively or continuously, with at least one layer of diamond-like carbon or similar material, and a process for producing flex circuits having diamond-like carbon layers. More specifically, the invention relates to amorphous diamond-like carbon film and to materials having similar properties that enhance the performance, manufacturability, reliability, versatility, and/or assembly of flexible circuit carriers, and corresponding flexible circuits made therewith.

BACKGROUND OF THE INVENTION

Flexible circuits are circuits which are formed on flexible dielectric substrates such as polymeric materials. The circuits may have one or more conductive layers as well as circuitry on one of the major surfaces or on both major surfaces. The circuits often include additional functional layers, e.g., insulative layers, adhesive layers, encapsulating layers, stiffening layers and the like. Flexible circuits are typically useful for electronic packages where flexibility, weight control and the like are important. In many high volume situations, flexible circuits also provide cost advantages associated with efficiency of the manufacturing processes employed.

U.S. Pat. No. 4,914,551 discloses circuits as provided on flexible dielectric materials. U.S. Pat. No. 4,231,154 discloses a flexible circuit with conductive traces on one or more layers. U.S. Pat. No. 4,480,288 discloses flexible circuits with circuitry on both major surfaces. U.S. Pat. No. 5,401,913 discloses a multi-layer flexible circuit consisting of multiple flexible circuits stacked relative to one another and interconnected using metallized through-holes commonly referred to as vias. All of these references disclose various aspects of flexible circuits, but none make mention of the benefits of utilizing diamond-like carbon or materials providing diamond-like carbon properties to enhance the performance and functionality of flex circuits. All of these referenced patents are hereby incorporated by reference.

Various types of flexible circuits are known in the industry. Generally speaking, the key differences in the various circuits stem from a number of design requirements for the devices that the circuit is connecting together along with the requirements and limitations of the processing methods used to make the circuit. Typically, the flexible circuit is connecting a semi-conductor of some sort (integrated circuit, microprocessors, or the like) to another flex circuit, a rigid circuit board or a component of a device. The design factors associated with items the circuit is connecting include, but are not limited to, the number of input and output (I/O) leads from a semi-conductor that needs to be connected, the means and process for interconnection of the flexible circuits to another circuit or to a device, the required size and weight of the finished product, the environmental conditions under which the circuit will be assembled and used, and the data transmission rates to which the circuit will be subjected. All of these design factors as well as the methods and equipment used to manufacture the circuit will at least partially determine circuit design parameters such as whether the means for interconnecting the flexible circuit to another item is a Ball Grid Array (BGA), array of bonding pads, or series of discrete leads; whether the circuit has one or more conductive layers, and if so, on one or both sides; if the materials need to be chemically stable to prevent outgassing; or if they need to be compatible for use and assembly at elevated temperature and humidity levels.

Diamond coatings, diamond-like carbon films, and uses for them are also known. These coatings and films possess a number of desirable properties, including high hardness, optical clarity, low friction, high thermal conductivity, high dielectric constant, high chemical stability, low gas and vapor permeability, and other properties. Furthermore, the composition of diamond-like carbon can be modified to control the measured value for many of these properties. The typical properties for diamond-like carbon are presented in the table below.

| Typical Properties for Diamond-Like Carbon | |
|---|---|
| Density, $g/cm^3$ | 1.6–3.0 |
| Hardness, Vickers, $kg/mm^2$ | 2000–9000 |
| Young's Modulus, Gpa | 100–200 |
| Dielectric Constant | 8–12 (between 45 MHz and 20 GHz) |
| Electrical Resistivity, ohms/cm | $10^5$–$10^{15}$ |
| Excitation Coefficient | .001–0.5 (between 200 and 1000 nm) |
| Index of Refraction @ 10 $\mu m$ | 1.8–2.4 |
| Optical Band-Gap | 0.8–3.0 eV |
| Thermal Conductivity @ 25 C., W/m-K | 400–1000 |

Diamond-like carbon coatings and films may be formed and deposited by processes using hydrocarbon or carbon sources. Carbon source deposition methods include ion beam sputter deposition, laser ablation deposition, ion beam assisted carbon evaporation. Hydrocarbon source deposition methods include ion beam, microwave plasma, and directed plasma discharge, various types of plasma-assisted chemical deposition methods, radio frequency plasma deposition, cathodic arc deposition, and the like. U.S. Pat. Nos. 4,698,256; 4,400,410; 4,383,728; 4,504,410; and 4,746,538 disclose processes for producing diamond-like carbon films and coatings, all of which are incorporated herein by reference.

Diamond and diamond-like carbon films are currently being used in a variety of applications. These applications include eyeglasses, semiconductors, drilling and machining tools, beverage containers, and many other applications requiring the properties afforded by diamond-like carbon. U.S. Pat. No. 5,508,071 discloses an annular interior surface having a layer of diamond coating for improve abrasion resistance. The coating is deposited on substrates such as metal, alloys, and ceramics. Because chemical vapor deposition (CVD) of diamond layers takes place at very high temperatures, it cannot be used for many polymeric substrates such as polyimide which will degrade at the elevated diamond-forming temperatures. Further, the polycrystalline nature of CVD diamond dictates a very hard, brittle coating with little flexibility.

The term "diamond-like carbon" is typically applied to noncrystalline materials, especially those in which tetrahedral diamond bonds predominate. U.S. Pat. No. 4,576,964 discloses barrier films made from flexible polymeric substrates having amorphous carbon coatings adhering thereto. U.S. Pat. No. 5,508,092 discloses optically transparent abrasion wear resistant coated substrates comprising a parent substrate, one or more interlayers and a top coating of diamond-like carbon or other low-friction material. U.S. Pat. No. 5,559,367 discloses the use of diamond-like carbon to electrically insulate levels within semiconductors. U.S. Pat. No. 4,809,876 discloses polymeric beverage containers utilizing a coating of diamond-like carbon to reduce the gas and vapor permeability through the container.

The current inventors have now discovered that one or more conformal coatings of diamond-like carbon deposited onto a carrier for a flexible circuit or a tab tape construction during the appropriate steps of the manufacturing process results in an improved construction exhibiting a number of desirable physical and functional attributes not otherwise possible with existing flex circuit constructions or materials. These attributes contribute to improvements in the areas of manufacturability, performance, cost, reliability, and versatility of the flex circuit. Although diamond-like carbon is the preferred material to provide the desired improvements and enhancements, other materials having the properties comparable to diamond-like carbon could also be used.

SUMMARY OF THE INVENTION

In the broadest aspect, this invention provides a carrier for a flexible circuit comprising at least one feature having at least one conformal layer of a coating deposited thereon, said material having a Young's Modulus of from about 100 to about 200 GPa, a dielectric constant between 45 MHz and 20 GHz of from about 8 to about 12, and a Vickers hardness of from about 2000 to about 9000 kg/mm$^2$.

The invention also provides flexible circuits comprising such carrier and electrical traces. The circuitry may be formed by any conventional processes, and of any conventional materials.

Preferred carriers for flexible circuits of the invention are those having at least one conformal layer of diamond-like carbon deposited on at least a portion of one surface or feature thereof.

In one embodiment, a conformal layer of diamond-like carbon is deposited as a covercoat over one entire layer of the carrier or flexible circuit; in another embodiment a layer is deposited only on selected areas, such as around vias or through-holes. A conformal coating of diamond-like carbon may also be deposited on features other than surfaces such as the interior walls of such vias or through-holes. In yet another embodiment, layers of diamond-like carbon are deposited on a plurality of layers as the circuit structure is built.

In one embodiment, polymeric flexible circuits and carriers of the invention are formed from a flexible dielectric material, and include a first intermediate layer coated thereon, and a conformal diamond-like carbon second intermediate layer coated thereon, and an electrically conductive layer coated thereon.

In another embodiment, an overcoated flex circuit is useful for environmentally sensitive applications and/or applications where a mask for a least a portion of the circuit is needed. A conformal layer of diamond-like carbon coated over the flex circuit insulates the conductive traces, and eliminates the potential for contamination from outgassing. The invention also provides a process for making a flexible circuit carrier wherein features to be subjected to laser drilling or ablation are strengthened by the layer of diamond-like carbon, allowing for improved features to be created. Such features have better planarity and surface characteristics than those features formed without the conformal layer of material.

The following terms have the defined meanings when used herein.

1. The terms "carrier" and "flexible circuit carrier" mean a package useful for a flexible circuit, but which does not yet have circuit traces formed thereon.

2. The term "aperture" refers to an opening in a layer of the flexible circuit carrier. The aperture may extend through a portion of the layer, or may extend completely through the layer. Apertures may be formed by a variety of techniques including mechanical punching, chemical milling, and laser ablation.

3. The term "through hole" refers to an aperture which extends completely through a layer of the flexible circuit carrier exposing a metal trace on one side.

4. The term "via" refers to a metallized through hole that connects a conductive trace to another conductive trace or plane.

5. The term "blind via" refers to a metallized aperture which does not extend completely through a layer of the flexible circuit carrier.

6. The terms "diamond-like carbon" and "carbon rich film" are synonymous and interchangeable in the industry, and refer to carbon films primarily consisting of carbon without long range atomic order as disclosed in Plasma Deposited Films, Ed. J. Mort and F. Joanne, CRC Press, Boca Raton, Fla., 1986.

7. The terms "tape automated bonding" and "TAB" are synonymous and refer to the format and assembly method of the circuit.

8. The terms "etching" and "milling" are used synonymously, and include mechanical, chemical and optical processes for removing material, including chemical etching, laser ablation, mechanical milling and the like.

9. The term "feature" means any subpart of a flexible circuit carrier, including such items as polymeric layers, metal layers, and surfaces of such layers, solder balls, traces, stiffeners, ground planes, and the like, without limitation.

10. The term "doping" means surface functionalization of the coating by introduction of another compound into the surface.

All ratios, parts, and percents described herein are by weight, unless otherwise specifically stated.

DETAILED DESCRIPTION OF THE INVENTION

Figure 1:
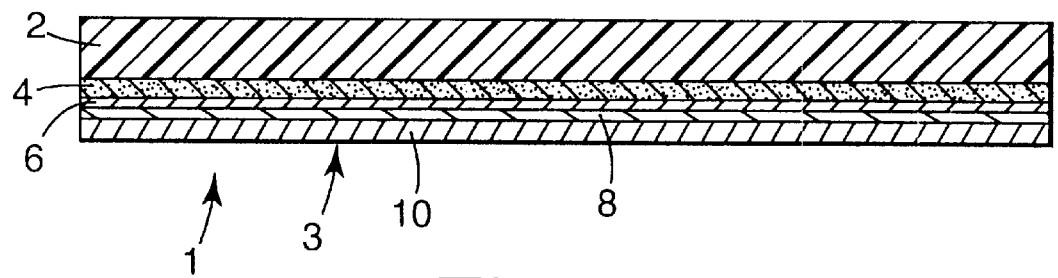
FIG. 1 is a cross-sectional view of a carrier for a flexible circuit showing a layer of diamond-like carbon deposited between the dielectric layer and a layer of conductive material.

Flexible circuits and carriers of the invention are those having coated on at least a portion of one feature, a conformal layer of a material having a said material having a Young's Modulus of from about 100 to about 200 GPa, a dielectric constant (between 45 MHz and 20 GHz) of from about 8 to about 12, and a Vickers hardness of from about 2000 to about 9000 kg/mm$^2$.

The conformal layer is deposited on at least one feature of the flexible circuit carriers and flexible circuits of the invention to provide a variety of benefits to the flexible polymer circuit. Layers may be deposited on features such as surface(s) of polymeric or metal layers, vias, solder balls, stiffeners, circuit traces and the like. Flexible circuits and carriers of the invention may have a single conformal layer of a coating on a single feature, or conformal coatings on multiple features. Multiple conformal layers of the material may also be used on a single feature.

Useful materials include diamond-like carbon, silicone nitride, boron nitride, boron, trifluoride, silicone carbide, silicone dioxide and the like.

Preferably, such material is diamond-like carbon (DLC). Also known as thin film carbon rich coatings, diamond-like carbon coatings contain two types of carbon-carbon bonds; trigonal graphite bonds (sp2) and tetrahedral diamond bonds (sp3), with tetrahedral bonds predominating. The films thus exhibit many of the properties of diamond, e.g., it is quite hard, chemically inert, corrosion resistant and impervious to water vapor and oxygen, and some of the properties of graphite, e.g., smoothness, and strong adhesion to polymeric materials. It also has an extremely low electrical conductivity and optical transparency over a wide range. Useful diamond-like carbon layers for flexible circuit carriers and flexible circuits of the invention have a thickness of from about 500 Angstroms, to about 3000 Angstroms, preferably from about 1000 Angstroms to about 2000 Angstroms.

When tested against uncoated polyimide under the same conditions, a layer of diamond-like carbon having a thickness of 1000 Angstroms coated onto a 50 $\mu$m (2 mil) polyimide has been found to increase the definition, concentricity and registration of laser ablated apertures by as much as 95%; decrease the transmission rate of water and oxygen by as much as 92% and 93%, respectively; decrease adhesion loss between the polyimide and copper by as much as 96%; increase the flexural stiffness by as much as 43%, and virtually eliminate the scratching of the polyimide during processing. It has also been found that the circuits may be selectively coated to provide benefits in specific areas of the structure, or may be fully coated to provide improved strength and flex to all areas.

Depending on the application, it is desirable for the circuit or carrier to possess enhanced mechanical, thermal, electrical, optical, and physical properties such as flexural stiffness, surface hardness, thermal conductivity, dielectric constant, abrasion resistance, optical transmissivity, permeability, chemical stability, bond strength, and other properties. Enhancements to many of these properties has been exhibited by providing a conformal coating of one or more layers of diamond-like carbon on a flexible circuit or carrier feature of surface. In some cases, a layer or layers of diamond-like carbon will be deposited on the bare polyimide film prior to forming of the circuit. In other cases, it will be desirable to coat an intermediate layer or layers of diamond-like carbon between the various circuit forming steps such as development, etching, and plating, or between each of these steps. A layer of diamond-like carbon may also be coated onto any dielectric layer such as the metallic layers. The desired attributes of the resulting construction dictate the design, placement, and number of the diamond-like carbon layers. Any additional layers must also be flexible enough to bend with the flex circuits to facilitate processing, handling and assembly without causing cracking or causing damage to the circuit.

Circuits of the invention may comprise diamond-like carbon layers coated by any of the variety of methods (ion beam, plasma, etc.) which have been developed to deposit such layers including those using either solid carbon or hydrocarbon sources. The deposition method may be batch-wise deposition or continuous deposition, although continuous deposition is preferred for manufacturing efficiency.

In preferred articles and processes of the invention, diamond-like carbon layers are deposited using a continuous plasma process coupled with ion acceleration. In general, the carbon rich plasma is created by applying a high frequency electric field to a carbon containing environment by powering a rotatable electrode element. Ions within the carbon rich plasma accelerate toward the electrode, where they strike a substrate in contact with the rotating electrode.

The diamond-like carbon (DLC) film deposition is made onto a moving substrate, and the coating apparatus, by providing an electrode in contact, at least in part, with the moving substrate. The electrode becomes negatively biased with respect to the plasma, thereby accelerating the ions toward the electrode, where they strike the moving substrate resulting in deposition of diamond-like carbon thereon. This process provides a thin DLC coating in which flaking is minimized, and the continuous process allows discriminate coating of substrates rather than indiscriminate coated of the entire evacuated chamber, providing improved efficiency, reduced waste, and the like. The diamond-like carbon coating may be formed in a variety of widths, with little or no cross web variation in coating weight or thickness. Details of the processes and apparatus therefore are taught, infra.

The diamond-like carbon may also be surface functionalized with such materials as fluorine, silicon, oxygen, sulfur, nitrogen, copper, chromium, titanium, and nickel. Surface functionalization can be achieved using a blend of suitable gases during the final stages of diamond-like carbon deposition, by gradually increasing the respective gas concentration and decreasing the hydrocarbon precursor concentration. Such process is also called "doping".

When the deposition is done in a continuous mode, as by the preferred method, the surface functionalization can be accomplished by installing a box containing the desired alternate gases before the diamond-like carbon coated web leaves the coating zone. Suitable silicon gases include, but are not limited to silane $SiH_4$, tetramethylsilane (TMS), and tetraethoxysilane (TEOS). Suitable oxygen gases include but are not limited to oxygen, water vapor, hydrogen peroxide vapor, ozone, $SO_2$, and $SO_3$ Suitable sulfur gases include but are not limited to $H_2S$, $SO_2$, $SO_3$, $SF_6$, carbon disulfide $CS_2$. Suitable nitrogen gases include but are not limited to $NH_3$, $NF_3$, $NO_2$, and $N_2O$. Suitable gases using copper include, but are not limited to, copper acetylacetonate and copper chloride. Suitable chromium gases include, but are not limited to, dimethylchromium. Suitable titanium gases include, but are not limited to, $TiCl_3$, and $TiCl_4$. Suitable nickel gases include, but are not limited to nickel acetate and nickel chloride. Most can also be co-evaporated or sputtered from their elemental forms during the final stages of DLC deposition.

The substrate is a flexible polymeric film material which is substantially fully cured. Useful organic polymers include polyimides including modified polyimides such as polyester imides and poly-imide-esters, polysiloxane imides, and polyamide, polymethylmethacrylate, polyesters such as poly (ethylene terephthalate), polycarbonates, polytetrafluoroethylenes and mixtures thereof. The polyimides are preferred, with an especially preferred polyimide polymer being made from the anhydride of pyromellitic acid and 4,4 diaminodiphenyl ether available from E.I. DuPont de Nemours and Company under the tradename Kapton®. Variations include Kapton® H, Kapton® E and Kapton V®, among others. Another polyimide precursor is also available from DuPont as Pyralin®.

The conductive layer(s) are typically formed from conductive metals such as tin, gold, silver, copper, chromium and the like. The thickness and disposition of such layers is highly dependent on the particular type of circuit or electronic package desired.

DETAILED DESCRIPTION OF THE DRAWINGS

Figure 2:
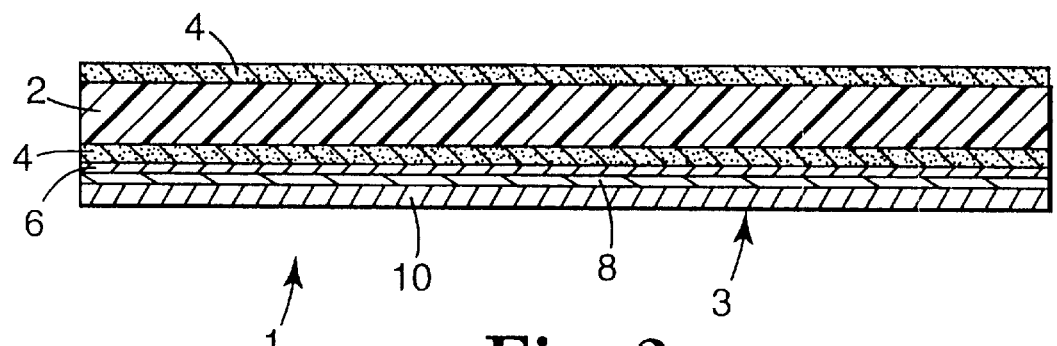
FIG. 2 is a cross-sectional view of a carrier for a flexible circuit showing diamond-like carbon deposited on both sides of the dielectric layer.
Figure 3:
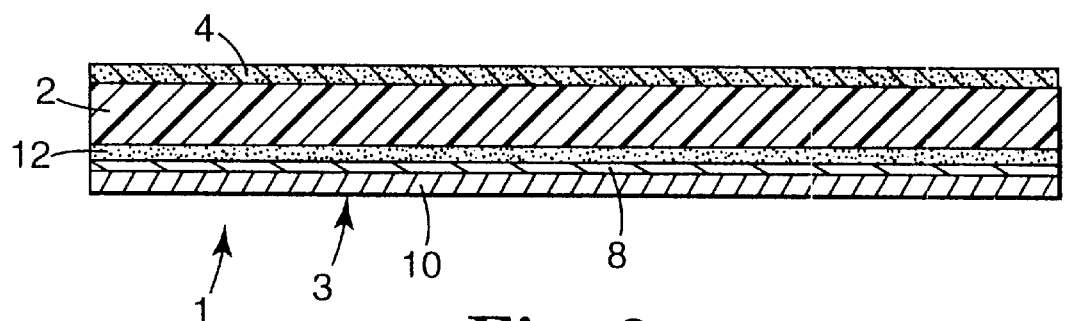
FIG. 3 is a cross-sectional view of a carrier for a flexible circuit showing a layer of diamond-like carbon deposited between the non-circuit side of the dielectric layer.

FIG. 1 shows a flexible circuit carrier 1 having a polymeric dielectric layer 2 with a layer of diamond-like carbon 4 deposited between the polymeric dielectric layer 2 and a conductive trace layer 3. The layer of diamond-like carbon includes a functionalized region 6 adjacent conductive trace layer 3 for enhancing the bond strength between the layer of diamond-like carbon and conductive trace layer 3. The conductive trace layer 3 includes a seed layer 8 of conductive material and an electroplated layer 10 of conductive material. The seed layer 8 can be deposited using techniques such as sputtering, vapor deposition, vacuum deposition, or other known methods for depositing thin layers of conductive materials. FIG. 2 shows the same carrier 1 as shown in FIG. 1 with a layer of diamond-like carbon 4 deposited on the non-circuit side of the carrier 1. FIG. 3 shows a carrier 1 for a flexible circuit having a layer of diamond-like carbon 4 deposited on the non-circuit side of the carrier 1. Intermediate layer 12 is provided to promote adhesion between the dielectric material 2 and seed layer 8.

Figure 4:
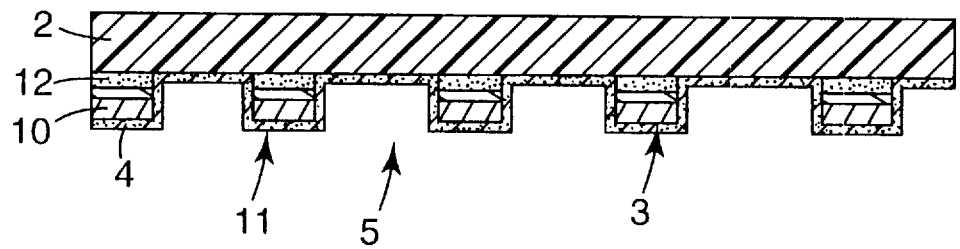
FIG. 4 is a cross-sectional view of a flexible circuit showing a layer of diamond-like carbon deposited over the circuit traces.

FIG. 4 shows a flexible circuit carrier 5 having a layer of diamond-like carbon 4 over at least portions of the conductive traces 11. Optionally, the circuit 5 can also have a layer of diamond-like carbon 4 on the non-circuit side of the polymeric dielectric layer 2. Intermediate layer 12 is provided to promote adhesion between the dielectric material 2 and the conductive trace layer 3.

Figure 5:
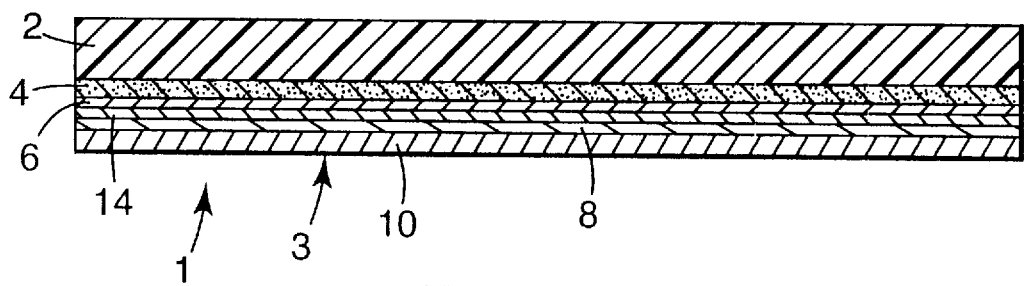
FIG. 5 is a cross-sectional view of a carrier for a flexible circuit showing a layer of diamond-like carbon deposited on the circuit side of the dielectric layer and a layer of layer light absorbing material between the layer of diamond-like carbon and the conductive layer.
Figure 6:
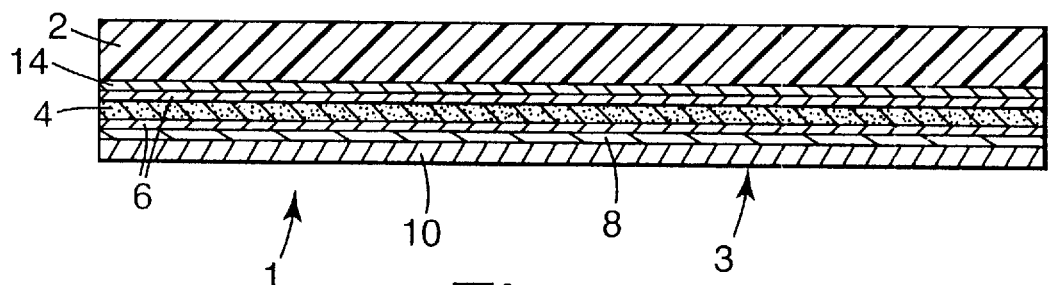
FIG. 6 is a cross-sectional view of a carrier for a flexible circuit showing a layer of laser light absorbing material deposited on the circuit side of the dielectric layer and a layer of diamond-like carbon between the layer of laser light absorbing material and the conductive layer.
Figure 7:
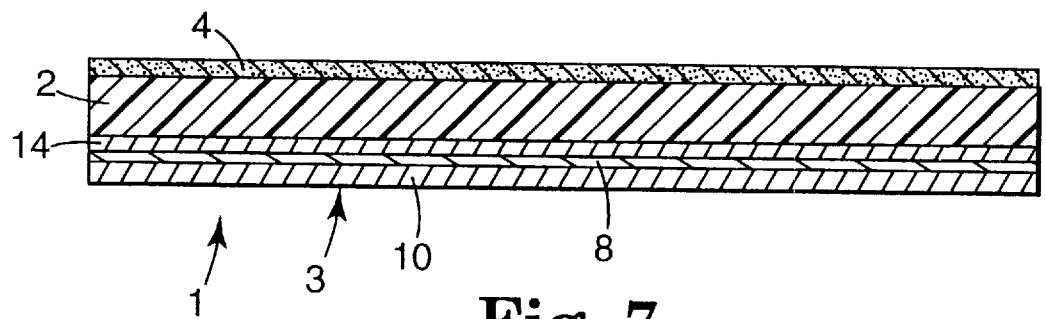
FIG. 7 is a cross-sectional view of a carrier for a flexible circuit showing a layer of laser light absorbing material deposited on the circuit side of the dielectric layer and a layer of diamond-like carbon deposited to the non-circuit side of the dielectric layer.

FIGS. 5 to 7 each show a flexible circuit carrier 1 having a layer of laser light absorbing material 14 incorporated therein. FIG. 5 shows a carrier 1 with a layer of diamond-like carbon 4 having a functionalized region 6 deposited on the circuit side of polymeric dielectric layer 2 and a layer of laser light material 14 deposited between the diamond-like carbon 4 and the conductive trace layer 3. In all cases where a layer of metallic material has an interface with a layer of diamond-like carbon 4, it is preferable for the layer of diamond-like carbon 4 to have a functionalized region 6 at the interface. FIG. 6 shows a carrier 1 with laser light absorbing material 14 deposited on the circuit side of the polymeric dielectric layer 2 and a layer of diamond-like carbon 4 having functionalized regions 6 between the laser light absorbing material 14 and the conductive trace layer 3. FIG. 7 shows a carrier 1 with a layer of diamond-like carbon 4 deposited on the non-circuit side of polymeric dielectric layer 2. A layer of laser light absorbing material 14 is deposited on the opposing side of the polymeric dielectric layer 2 between the polymeric dielectric layer 2 and the conductive trace layer 3.

Figure 8:
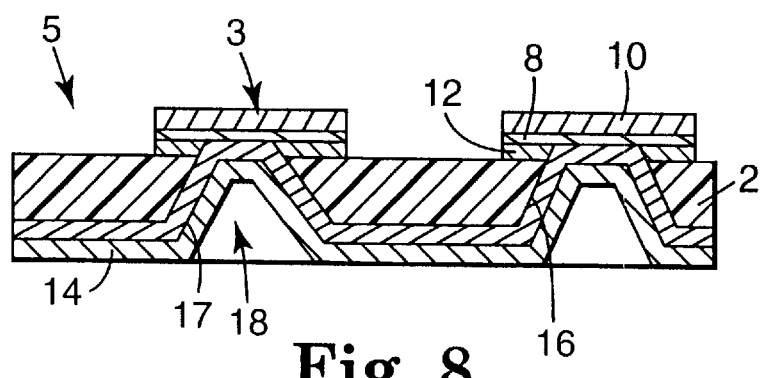
FIG. 8 is a cross-sectional view of a flexible circuit having at least one aperture through the dielectric layer, a layer of diamond-like carbon deposited on the non-circuit side of the circuit, and a layer of laser light absorbing material deposited on the layer of diamond-like carbon.
Figure 9:
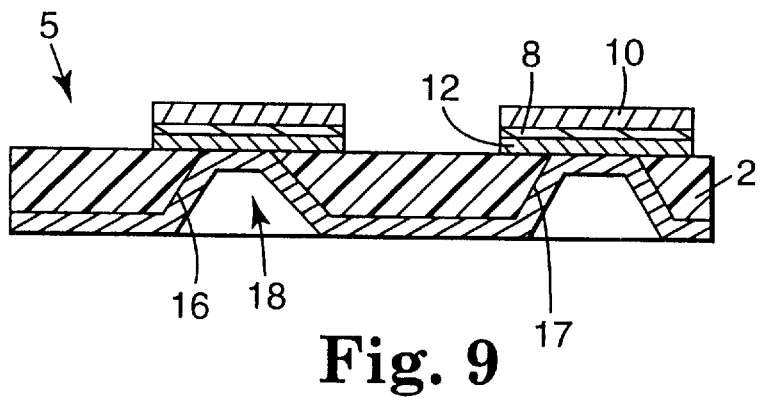
FIG. 9 is a cross-sectional view of a flexible circuit having at least one aperture through the dielectric layer, a layer of diamond-like carbon deposited on the non-circuit side of the circuit, and a layer of laser light absorbing material deposited on the circuit side of the dielectric layer.

FIGS. 8 and 9 each show a flexible circuit carrier 5 having a layer of laser light absorbing material 14 incorporated therein and at least one aperture 16 through at least the polymeric dielectric layer 2 forming cavity 18. The flexible circuit of FIG. 8 includes intermediate layer 12 for enhancing the bond strength between the polymeric dielectric layer 2 and the conductive trace layer 3. Preferably, the aperture 16 of FIG. 8 extends through the polymeric dielectric layer 2 and through the intermediate layer 12. Optionally, it could extend only through the dielectric material 2. A layer of diamond-like carbon 4 is deposited on the non-circuit side of the polymeric dielectric layer 2 and onto the interior surfaces 17 of cavity 18. The flexible circuit 5 of FIG. 9 has a laser light absorbing material 14 deposited on the circuit side of the polymeric dielectric layer 2 between the dielectric material 2 and the conductive trace layer 3. In FIG. 9, the laser light absorbing material 14 also serves to enhance the bond strength between the dielectric material 2 and the conductive trace layer 3.

Each flexible circuit carrier 1 shown in FIGS. 1, 2, 3, 5, 6, and 7 can be used for fabricating 1-metal layer or 2-metal layer circuits. As shown, each carrier 1 has a conductive trace layer 3 on only one side of the carrier 1. In the case of a 1-metal layer circuit, the other side of the polymeric dielectric layer 2 would not have a conductive trace layer 3 formed on it during subsequent processing steps. In the case of a 2-metal layer circuit, the other side of polymeric dielectric layer 2 would have a conductive trace layer 3 formed on it following fabrication of circuit traces on the first side. In most cases, at least one of the conductive traces on the first side would be connected to the conductive trace layer on the second side with one or more metallized vias. One or more diamond-like carbon layers may also be deposited onto the substrate layer, sputtered metal layers, electroplated metal layers, intermediate layers, other dielectric layers, and individual features of such layers, i.e. bumps or vias.

Description of the Deposition Process

The process of the present invention differs from conventional carbon coating processes and apparatuses where plasma creation and ion acceleration are caused by power applied to different elements and where formation of carbon-rich coatings occur on both the substrate and the apparatus rather than essentially just the substrate.

Figure 10:
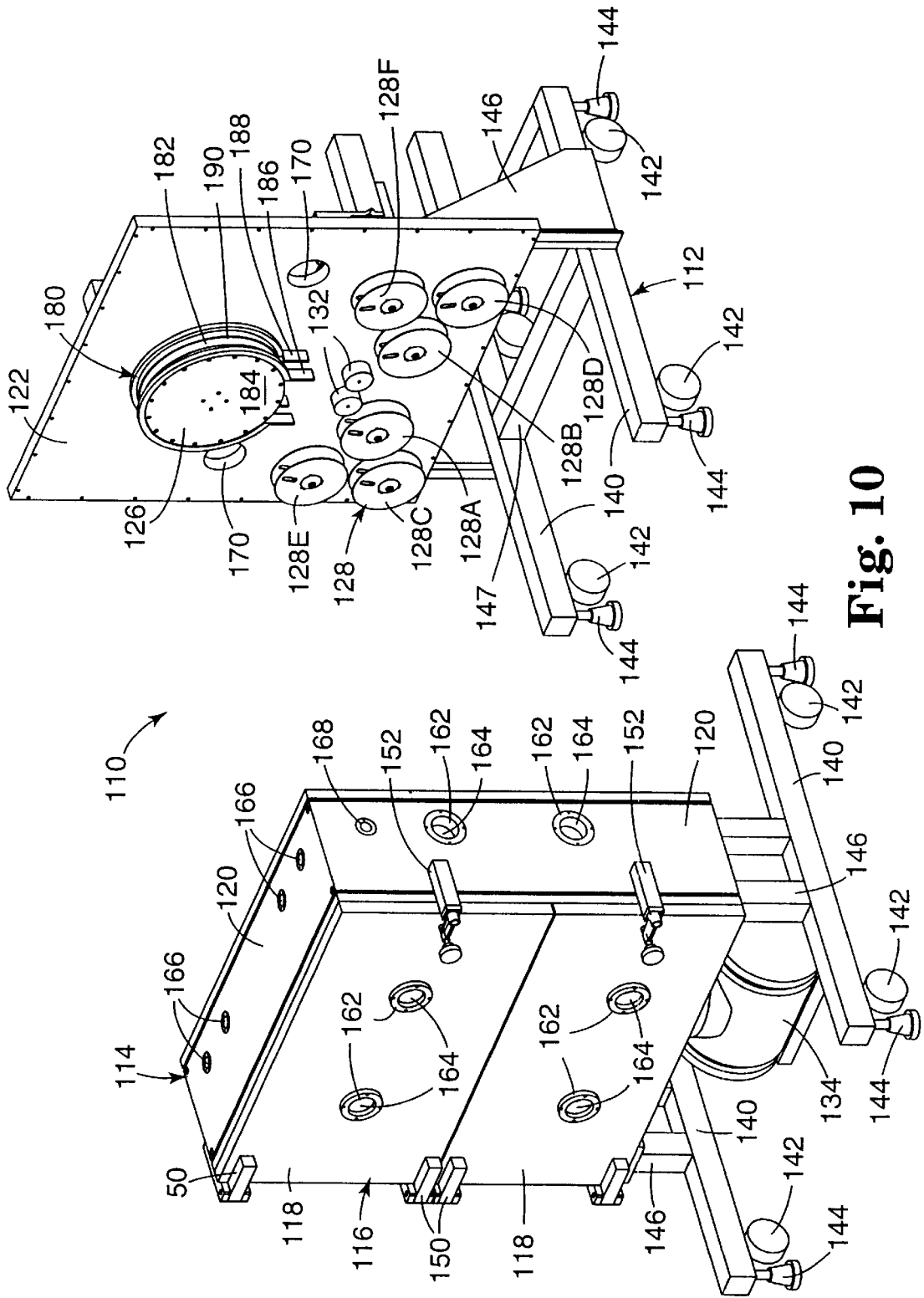
FIG. 10 is a first fragmentary perspective view of one embodiment of the coating apparatus of the present invention.
Figure 11:
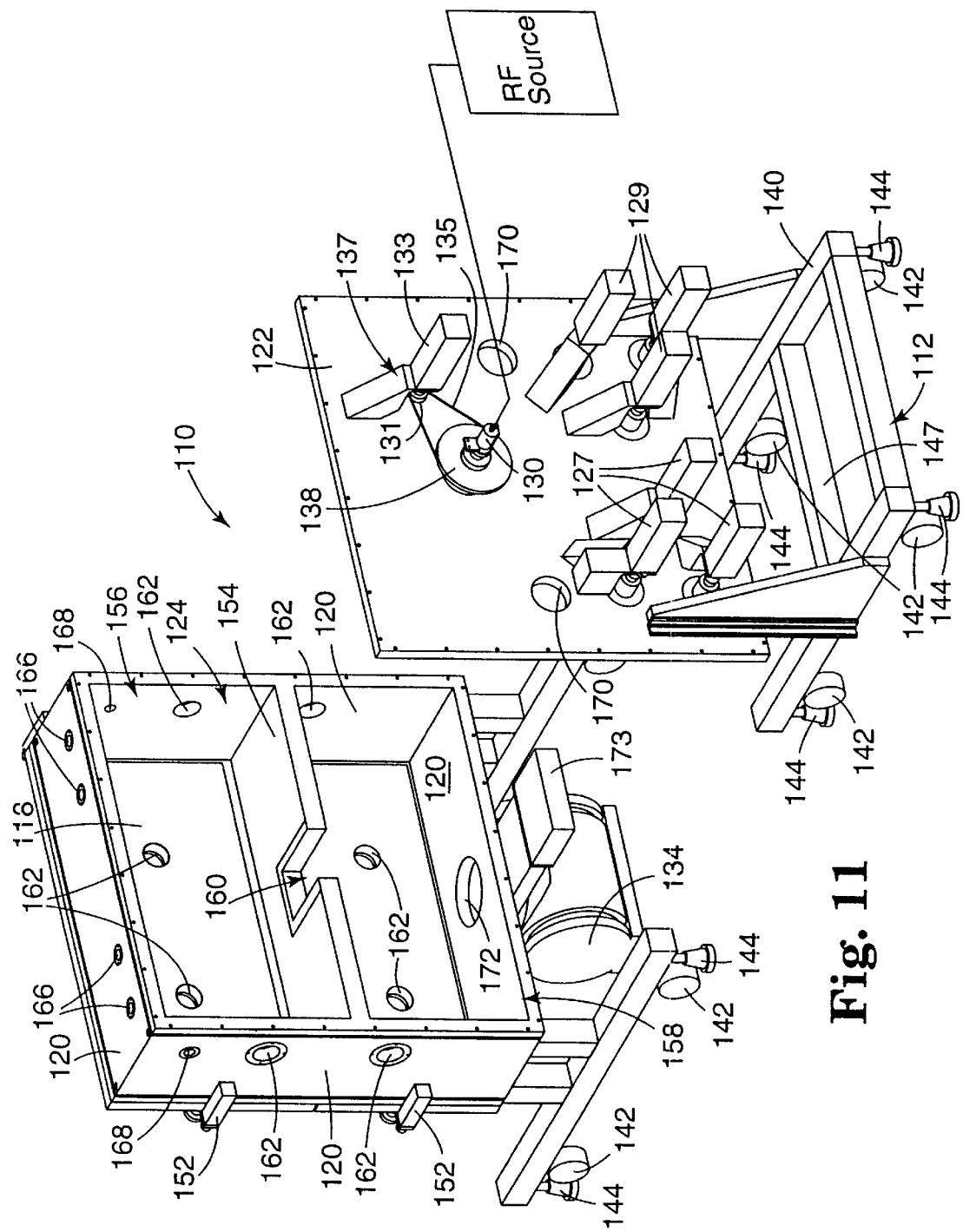
FIG. 11 is a second fragmentary perspective view of the apparatus of FIG. 10 taken from a different vantage point.

Referring to FIGS. 10 and 11, an embodiment of the carbon film deposition apparatus of the present invention with a common element for plasma creation and ion acceleration is generally indicated as 110. This deposition apparatus 110 includes a support structure 112, a housing 114 including a front panel 116 of one or more doors 118, side walls 120 and a back plate 122 defining an inner chamber 124 therein divided into one or more compartments, a drum 126 rotatably affixed within the chamber, a plurality of reel mechanisms rotatably affixed within the chamber and referred to generally as 128, drive mechanism 137 for rotatably driving drum 126, idler rollers 132 rotatably affixed within the chamber, and vacuum pump 134 fluidly connected to the chamber.

Support structure 112 is any means known in the art for supporting housing 114 in a desired configuration, a vertically upright manner in the present case. As shown in FIGS. 10 and 11 housing 114 can be a two-part housing as described below in more detail. In this embodiment, support structure 112 includes cross supports 140 attached to each side of the two-part housing for supporting apparatus 110. Specifically, cross supports 140 include both wheels 142 and adjustable feet 144 for moving and supporting, respectively, apparatus 110. In the embodiment shown in FIGS. 10 and 11, cross supports 140 are attached to each side housing 114 through attachment supports 146. Specifically, cross supports 140 are connected to one of side walls 120, namely the bottom side wall, via attachment supports 146, while cross supports 140 on the other side of housing 114 are connected to back plate 122 by attachment supports 146. An additional crossbar 147 is supplied between cross supports 140 on the right-hand side of apparatus 110 as shown in FIG. 10. This can provide additional structural reinforcement.

Housing 114 can be any means of providing a controlled environment that is capable of evacuation, containment of gas introduced after evacuation, plasma creation from the gas, ion acceleration, and film deposition. In the embodiment shown in FIGS. 10 and 11, housing 114 has outer walls that include front panel 116, four side walls 120, and a back plate 122. The outer walls define a box with a hollow interior, denoted as chamber 124. Side walls 120 and back plate 122 are fastened together, in any manner known in the art, to rigidly secure side walls 120 and back plate 122 to one another in a manner sufficient to allow for evacuation of chamber 124, containment of a fluid for plasma creation, plasma creation, ion acceleration, and film deposition. Front panel 116 is not fixedly secured so as to provide access to chamber 124 to load and unload substrate materials and to perform maintenance. Front panel 116 is divided into two plates connected via hinges 150 (or an equivalent connection means) to one of side walls 120 to define a pair of doors 118. These doors seal to the edge of side walls 120, preferably through the use of a vacuum seal (e.g., an O-ring). Locking mechanisms 152 selectively secure doors 118 to side walls 120 and can be any mechanism capable of securing doors 118 to walls 120 in a manner allowing for evacuation of chamber 124, storage of a fluid for plasma creation, plasma creation, ion acceleration, and film deposition.

In one embodiment, chamber 124 is divided by a divider wall 154 into two compartments 156 and 158. A passage or hole 160 in wall 154 provides for passage of fluids or substrate between compartments. Alternatively, the chamber can be only one compartment or three or more compartments.

Housing 114 includes a plurality of view ports 162 with high pressure, clear polymeric plates 164 sealably covering ports 162 to allow for viewing of the film deposition process occurring therein. Housing 114 also includes a plurality of sensor ports 166 in which various sensors (e.g., temperature, pressure, etc.) can be secured. Housing 114 further includes inlet ports 168 providing for conduit connection through which fluid can be introduced into chamber 124 as needed to supply an environment conducive to film deposition. Housing 114 also includes pump ports 170 and 172 that allow gases and liquids to be pumped or otherwise evacuated from chamber 124.

Pump 134 is shown suspended from one of sides 120, preferably the bottom (as shown in FIG. 11). Pump 134 can be, for example, a turbo-molecular pump fluidly connected to the controlled environment within housing 114. Other pumps, such as diffusion pumps or cryopumps, can be used to evacuate lower chamber 158 and to maintain operating pressure therein. Sliding valve 173 is positioned along this fluid connection and can selectively intersect or block fluid communication between pump 134 and the interior of housing 114. Sliding valve 173 is movable over pump port 162 so that pump port 162 can be fully open, partially open, or closed with respect to fluid communication with pump 134.

Drum 126 preferably is a cylindrical electrode 180 with an annular surface 182 and two planar end surfaces 184. The electrode can be made of any electrically conductive material and preferably is a metal such as, for example, aluminum, copper, steel, stainless steel, silver, chromium or an alloy of any one or more of the foregoing. Preferably, the electrode is aluminum, because of the ease of fabrication, low sputter yield, and low costs.

Drum 126 is further constructed to include non-coated, conductive regions that allow an electric field to permeate outward as well as non-conductive, insulative regions for preventing electric field permeation and thus for limiting film coating to the non-insulated or conductive portions of the electrode. The electrically non-conductive material typically is an insulator, such as a polymer (e.g., polytetrafluoroethylene). Various embodiments that fulfill this electrically non-conductive purpose so as to provide only a small channel, typically the width of the substrate to be coated, as a conductive area can be envisioned by one of ordinary skill in the art.

FIG. 10 shows an embodiment of drum 126 where annular surface 182 and end surfaces 184 of drum 126 are coated with an electrically non-conductive or insulative material, except for annular channel 190 in annular surface 182 which remains uncoated and thus electrically conductive. In addition, a pair of dark space shields 186 and 188 cover the insulative material on annular surface 182, and in some embodiments cover end surfaces 184. The insulative material limits the surface area of the electrode along which plasma creation and negative biasing may occur. However, since the insulative materials sometimes can become fouled by the ion bombardment, dark space shields 186 and 188 can cover part or all of the insulated material. These dark space shields may be made from a metal such as aluminum but do not act as conductive agents because they are separated from the electrode by means of an insulating material (not shown). This allows confinement of the plasma to the electrode area.

Figure 12:
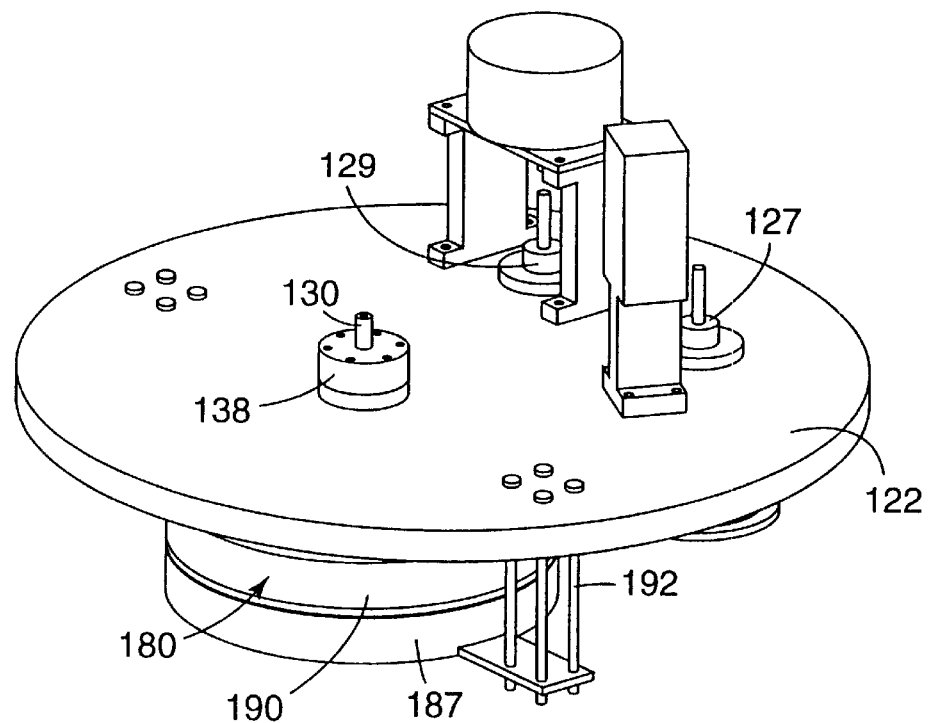
FIG. 12 is a fragmentary perspective view of another embodiment of the coating apparatus of the present invention removed from its gas containing chamber.
Figure 13:
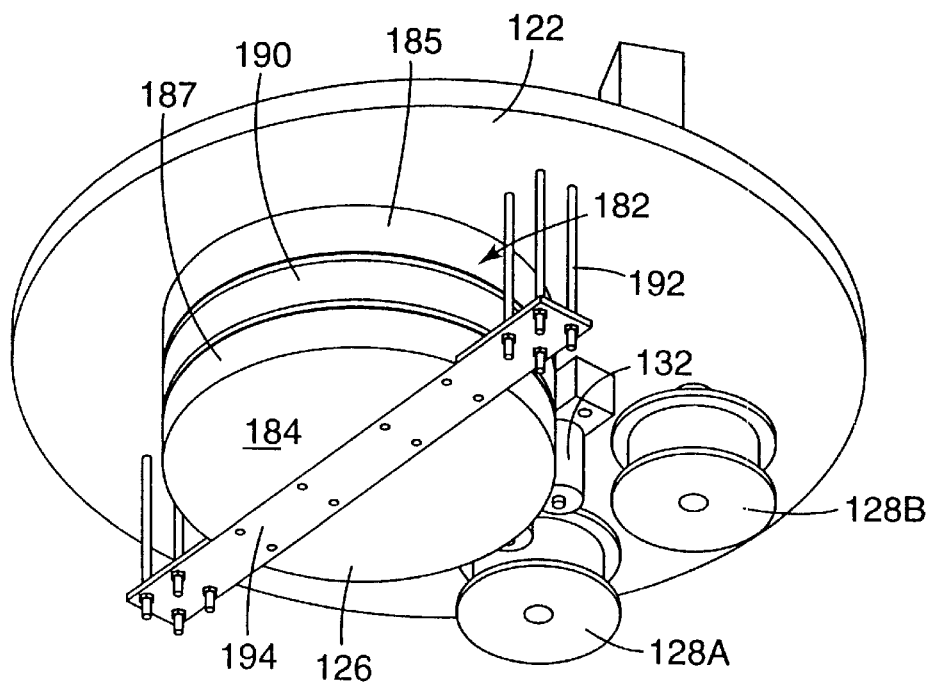
FIG. 13 is a second perspective view of the embodiment of FIG. 12 taken from a different vantage point.

Another embodiment of drum 126 is shown in FIGS. 12 and 13 where drum 126 includes a pair of insulative rings 185 and 187 affixed to annular surface 182 of drum 126. In some embodiments, insulative ring 187 is a cap which acts to also cover end surface 184. Bolts 192 secure support means 194, embodied as a flat plate or strap, to back plate 122. Bolts 192 and support means 194 can assist in supporting the various parts of drum 126. The pair of insulative rings 185 and 187, once affixed to annular surface 182, define an exposed electrode portion embodied as channel 190.

In any case, electrode 180 is covered in some manner by an insulative material in all areas except where the substrate contacts the electrode. This defines an exposed electrode portion that can be in intimate contact with the substrate. The remainder of the electrode is covered by an insulative material. When the electrode is powered and the electrode becomes negatively biased with respect to the resultant plasma, this relatively thick insulative material prevents carbon film deposition on the surfaces it covers. As a result, deposition is limited to the uncovered area (i.e., that which is not covered with insulative material, channel 190), which preferably is covered by relatively thin substrate material.

Referring to FIGS. 10 and 11, drum 126 is rotatably affixed to back plate 122 through a ferrofluidic feedthrough and rotary union 138 (or an equivalent mechanism) affixed within a hole in back plate 122. The ferrofluidic feedthrough and rotary union provide separate fluid and electrical connection from a standard coolant fluid conduit and electrical wire to hollow coolant passages and the conductive electrode, respectively, of rotatable drum 126 during rotation while retaining a vacuum seal. The rotary union also supplies the necessary force to rotate the drum during film deposition, which force is supplied from any drive means such as a brushless DC servo motor. However, connection of drum 126 to back plate 122 and the conduit and wire may be performed by any means capable of supplying such a connection and is not limited to a ferrofluidic feedthrough and a rotary union. One example of such a ferrofluidic feedthrough and rotary union is a two-inch (about 5 cm) inner diameter hollow shaft feedthrough made by Ferrofluidics Co. (Nashua, N.H.).

Drum 126 is rotatably driven by drive assembly 137, which can be any mechanical and/or electrical system capable of translating rotational motion to drum 126. In the embodiment shown in FIG. 11, drive assembly 137 includes motor 133 with a drive shaft terminating in drive pulley 131 that is mechanically connected to a driven pulley 139 rigidly connected to drum 126. Belt 135 (or equivalent structure) translates rotational motion from drive pulley 131 to driven pulley 139.

The plurality of reel mechanisms 128 are rotatably affixed to back plate 122. The plurality of reel mechanisms 128 includes a substrate reel mechanism with a pair of substrate spools 128A and 128B, and, in some embodiments, also can include a spacing web reel mechanism with a pair of spacing web spools 128C and 128D, and masking web reel mechanism with a pair of masking web spools 128E and 128F, where each pair includes one delivery and one take-up spool. As is apparent from FIG. 11, at least each take-up reel 128B, 128D, and 128F includes a drive mechanism 127 mechanically connected thereto such as a standard motor as described below for supplying a rotational force that selectively rotates the reel as needed during deposition. In addition, each delivery reel 128A, 128C, and 128E in select embodiments includes a tensioner for supplying tautness to the webs and/or a drive mechanism 129.

Each reel mechanism includes a delivery and a take-up spool which may be in the same or a different compartment from each other, which in turn may or may not be the same compartment the electrode is in. Each spool is of a standard construction with an axial rod and a rim radially extending from each end defining a groove in which an elongated member, in this case a substrate or web, is wrapped or wound. Each spool is securably affixed to a rotatable stem sealably extending through back plate 122. In the case of spools to be driven, the stem is mechanically connected to a motor 127 (e.g., a brushless DC servo motor). In the case of non-driven spools, the spool is merely coupled in a rotatable manner through a coupling 129 to back plate 122 and may include a tension mechanism to prevent slack.

A preferred type of substrate is a flexible web. Common examples include polymeric (e.g., polyester, polyamide, polyimide, polycarbonate, polyurethane, or polyolefin) webs and webs having at least one surface including a metallized coating, that can be used to define one or more electrical circuits. (See, e.g., U.S. Pat. No. 5,227,008, incorporated herein by reference, for a description of such a membrane.) When a spool of the latter type of web is used, the process and apparatus of the present invention can apply a carbon-rich coating (e.g., a DLC coating) to one surface of the entire length of the web. Thus, the web or any material coated thereon, such as an electrical circuit, can be protected by a uniform coating of a carbon-rich material.

Film deposition apparatus 110 also includes idler rollers 132 rotatably affixed within the chamber and pump 134 fluidly connected to the chamber. The idler rollers guide the substrate from the deposition substrate spool 128A to channel 190 on drum 126 and from channel 190 to take-up substrate spool 128B. In addition, where spacing webs and masking webs are used, idler rollers 132 guide these webs and the substrate from deposition substrate spool 128A and deposition masking web spool 128E to channel 190 and from channel 190 to take-up substrate spool 128B and take-up masking web spool 128F, respectively.

Film deposition apparatus 110 further includes a temperature control system for supplying temperature controlling fluid to electrode 180 via ferrofluidic feedthrough 138. The temperature control system may be provided on apparatus 110 or alternatively may be provided from a separate system and pumped to apparatus 110 via conduits so long as the temperature control fluid is in fluid connection with passages within electrode 180. The temperature control system may heat or cool electrode 180 as is needed to supply an electrode of the proper temperature for film deposition. In a preferred embodiment, the temperature control system is a coolant system using a coolant such as, for example, water, ethylene glycol, chlorofluorocarbons, hydrofluoroethers, and liquefied gases (e.g., liquid nitrogen).

Film deposition apparatus 110 also includes an evacuation pump fluidly connected to evacuation port(s) 170. This pump may be any vacuum pump, such as a Roots™ blower, a turbo molecular pump, a diffusion pump, or a cryopump capable of evacuating the chamber. In addition, this pump may be assisted or backed up by a mechanical pump. This evacuation pump may be provided on apparatus 110 or alternatively may be provided as a separate system and fluidly connected to the chamber.

Film deposition apparatus 110 also includes a fluid feeder, preferably in the form of a mass flow controller that regulates the fluid used to create the thin film, the fluid being pumped into the chamber after evacuation thereof. The feeder may be provided on apparatus 110 or alternatively may be provided as a separate system and fluidly connected to the chamber. The feeder supplies fluid in the proper volumetric rate or mass flow rate to the chamber during deposition. In a preferred embodiment, the film created is a thin carbon film having diamond-like properties. This film is created from a gas, supplied by the feeder, that contains molecules that include carbon atoms. Hydrocarbons are particularly preferred, although such species as buckminsterfullerenes, cyanide, tetramethylsilane, and halogenated carbon-containing gases such as fluorocarbons, chlorocarbons, and chlorofluorocarbons also are potentially useful. Hydrocarbons particularly useful for rapid carbon-rich (DLC) coatings include benzene, methylcyclopentadiene, butadiene, pentadiene, styrene, naphthalene, and azulene. Gases with low ionization potentials, that is 10 eV or less, can be used and preferably are used for continuous deposition of carbon-rich coating in this process.

Film deposition apparatus 110 also includes a power source electrically connected to electrode 180 via electrical terminal 130. The power source may be provided on apparatus 110 or alternatively may be provided on a separate system and electrically connected to the electrode via electrical terminal (as shown in FIG. 11). In any case, the power source is any power generation or transmission system capable of supplying sufficient power.

Although a variety of power sources are possible, radio frequency (RF) power is preferred. This is because the frequency is high enough to form a self bias on an appropriately configured powered electrode but not high enough to create standing waves in the resulting plasma, which would be inefficient for ion deposition. RF power is scalable for high coating output (wide webs or substrates, rapid web speed). When RF power is used, the negative bias on the electrode is a negative self bias, i.e., no separate power source need be used to induce the negative bias on the electrode. Because RF power is preferred, the remainder of this discussion will focus exclusively thereon.

The RF power source powers electrode 180 with a frequency in the range of 0.01 to 50 MHz, preferably 13.56 MHz or any whole number (e.g., 1, 2, or 3) multiple thereof. This RF power as supplied to electrode 180 creates a carbon rich plasma from the hydrocarbon gas within the chamber. The RF power source can be an RF generator such as a 13.56 MHz oscillator connected to the electrode via a network that acts to match the impedance of the power supply with that of the transmission line (which is usually 50 ohms resistive) so as to effectively transmit RF power through a coaxial transmission line.

Upon application of RF power to the electrode, the plasma is established. In an RF plasma the powered electrode becomes negatively biased relative to the plasma. This bias is generally in the range of 500 to 1400 volts. This biasing causes ions within the carbon-rich plasma to accelerate toward electrode 180. Accelerating ions form the carbon-rich coating on the substrate in contact with electrode 180 as is described in more detail below.

In operation, a full spool of substrate upon which deposition is desired is inserted over the stem as spool 128A. Access to these spools is provided through lower door 118 since, in FIGS. 10 and 11, the spools are located in lower compartment 158 while deposition occurs in upper compartment 156. In addition, an empty spool is fastened opposite the substrate holding spool as spool 128B so as to function as the take-up spool after deposition has occurred on the substrate.

If a spacer web is desired to cushion the substrate during winding or unwinding, spacer web delivery and/or take-up spool can be provided as spools 128C and 128D (although the location of the spools in the particular locations shown in the figures is not critical). Similarly, if film deposition is desired in a pattern or otherwise partial manner, a masking web can be positioned on an input spool as spool 128E and an empty spool is positioned as a take-up spool as spool 128F.

After all of the spools with and without substrates or webs are positioned, the substrate on which deposition is to occur (and any masking web to travel therewith around the electrode) are woven or otherwise pulled through the system to the take-up reels. Spacer webs generally are not woven through the system and instead separate from the substrate just before this step and/or are provided just after this step. The substrate is specifically wrapped around electrode 180 in channel 190 thereby covering the exposed electrode portion. The substrate is sufficiently taut to remain in contact with the electrode and to move with the electrode as the electrode rotates so a length of substrate is always in contact with the electrode for deposition. This allows the substrate to be coated in a continuous process from one end of a roll to the other. The substrate is in position for film deposition and lower door 118 is sealed closed.

Chamber 124 is evacuated to remove all air and other impurities. Once a carbon-containing fluid, preferably a gas, is pumped into the evacuated chamber, the apparatus is ready to begin the process of film deposition.

The RF power source is activated to provide an RF electric field to electrode 180. This RF electric field causes the carbon-containing material to become ionized, resulting in the formation of a carbon rich plasma with ions therein. This is specifically produced using a 13.56 MHz oscillator, although other RF sources and frequency ranges may be used.

Once the plasma has been created, a negative DC bias voltage is created on electrode 180 by continuing to power the electrode with RF power. This bias causes ions to accelerate toward non-insulated electrode portion 190 of electrode 180 (the remainder of the electrode is either insulated or shielded). The ions bombard the length of substrate in contact with channel 190 of electrode 180 causing a densification of carbon resulting in the deposition of a thin diamond-like carbon film on that length of substrate.

For continuous deposition, the take-up spools are driven so as to pull the substrate and any masking webs through the upper compartment 154 and over electrode 180 so that deposition occurs on any unmasked substrate portions in contact with annular channel 190 (otherwise, the masking web receives the carbon film). The substrate is thus pulled through the upper compartment continuously while a continuous RF field is placed on the electrode and sufficient carbon-containing gas is present within the chamber. The result is a continuous carbon-rich coating on an elongated substrate, and substantially only on the substrate. Carbon film deposition does not occur on the insulated portions of the electrode nor does deposition occur elsewhere in the chamber, because only the electrode is biased. In addition, since the non-insulated portion of the electrode (i.e., annular channel 190) is covered almost or entirely by the substrate, little or no deposition occurs anywhere but on the substrate. This eliminates the need for frequent cleaning of the chamber and parts thereof and replacing the electrode due to carbon buildup. In cases where fouling of the insulated portion occurs, dark space shields 186 and 188 can be provided to prohibit or reduce fouling. Dark space shields 186 and 188 can be of any shape, size, and material that is conducive to the reduction of potential fouling. In the embodiment shown in FIGS. 10 and 11, dark space shields 186 and 188 are metal rings that fit over drum 126 and the insulation thereon. Dark space shields 186 and 188 do not bias due to the insulative material that covers drum 126 in the areas where dark space shields 186 and 188 contact drum 126. The dark space shields in this ring-like embodiment further include tabs on each end thereof extending away from drum 126 in a non-annular manner. These tabs can assist in aligning the substrate within channel 190.

Preferably, the temperature control system pumps fluid through electrode 180 throughout the process to keep the electrode at a desired temperature. Typically, this involves cooling the electrode with a coolant as described above, although heating in some cases may be desirable. In addition, since the substrate is in direct contact with the electrode, heat transfer from the plasma to the substrate is managed through this cooling system, thereby allowing the coating of temperature sensitive films such as polyethyleneterephthalate, polyethylene naphthalate, and the like.

After completion of the deposition process, the spools can be removed from shafts supporting them on the wall. The substrate with a carbon-rich film thereon is on spool 128B and is ready for use wherever thin carbon film coatings are used, such as for electrical isolation for chip cooling, flex-metal circuitry, fiber optics, optical coatings, photo- and microlithographic masks, recording heads and media, printer heads, orthodontia, abrasives, orthopedic implants, thin film capacitors, packaging films, laser device mounts, and numerous other uses.

Low ionization potential gases can be used to obtain extremely high deposition rates while still maintaining good properties in the thin carbon film. By using low ionization potential gases, very fast deposition is possible and low DLC coating film stress is produced. The DLC coating film stress is 0.4 GPa or lower, in comparison to 1 to 10 GPa for the DLC film stress reported in previous DLC coatings. Mass deposition on the substrate is at rates up to forty or more times higher than the prior art rates of deposition. Minimal deposition occurs anywhere except on the substrate, and, as a result, minimal flaking occurs. Furthermore, deposition is almost entirely due to ion bombardment rather than a mixture of ion bombardment and free radical contact. In addition, very high conversion yields (as much as 35%) of gas input to film output, in comparison to typically single digit yields in the prior art, can be obtained.

Other benefits and advantages of this process include the ability to coat over a broader range of substrate dimensions including widths of from about 15 cm to more than one meter. Substrate width is not a limiting factor since ion bombardment comes from all around the substrate in the chamber rather than from a source specific area. According to the method of the present invention, a substrate can be coated to a thickness up to about 0.2 $\mu$m at a rate of approximately 1.5 to 6 m/min, generally without regard to substrate width. Coating thicknesses in the range of 0.1 to 0.3 $\mu$m can be produced easily using this process, although thicker (i.e., up to about 10 $\mu$m) and thinner coatings also are possible.

Overall, plasma generation and ion acceleration is greatly simplified. Only one electrode is used rather than a source electrode and a target electrode. The powered electrode both creates the plasma and becomes negatively biased, thereby accelerating ions within the plasma toward itself for bombardment of the substrate in contact with itself. This DC biasing voltage also serves to density the deposited coating, which enhances the DLC properties.

Description of the Carrier and Circuit-Making Process

The process of making flexible circuits and carriers according to the invention comprises the step of depositing at least one layer of diamond-like carbon thereon which may be used in conjunction with various known procedures such as metal sputtering, plating resist laminating, resist exposing, developing, etching, and plating. The sequence of such procedures may be varied as desired for the particular application. Multiple deposition steps may be used where more than one layer of diamond-like carbon is desirable, e.g., a layer deposited directly on the substrate for improved planarity and via creation, and a layer deposited atop a metallic layer to provide such benefits as abrasion resistance and thermal management. The procedures described herein apply equally to carriers and flexible circuits.

One additive method for making a flexible circuit or carrier has a typical sequence of steps described as follows:

First, deposition of a conformal diamond-like carbon layer onto the polymer, e.g., polyimide side, of a film substrate. The substrate may be made by various methods such as adhesively bonding a cured polymer layer onto copper foil, coating liquid polyimide on copper foil or the like. Typically, the substrate consists of a polymeric film layer of from about 25 micrometers to about 125 micrometers, with the copper layer being from about 1 to about 5 micrometers thick.

Next, sputtering of the polyimide film with a seed layer of chrome and copper is performed. Photoresists, which may be aqueous or solvent based, and may be negative or positive photoresists, are then laminated onto both sides of a substrate having a polymeric film side and a copper side, using standard laminating techniques with hot rollers. The thickness of the photoresist is from about 35 to about 50 micrometers. The photoresist is then exposed on both sides to ultraviolet light or the like, through a mask or phototool, crosslinking the exposed portions of the resist. The unexposed portions of the photoresist are then developed with the appropriate, solvent, in the case of aqueous resists a dilute aqueous solution, e.g., a 0.5–1.5% sodium or potassium carbonate solution, is applied until desired patterns are obtained on both sides of the laminate. The copper side of the laminate is then further plated to desired circuit thickness. One or more layers of diamond-like carbon may also be deposited atop the copper if desired.

The diamond-like carbon layer in the developed area on the other side is then etched using oxygen plasma to expose the polyimide surface.

The laminate is then placed into a bath of concentrated base at a temperature of from about 50° C. to about 120° C. which etches the portions of the polymeric film not covered by the crosslinked resist. This exposes certain areas of the original thin copper layer. The resist is then stripped off both sides of the laminate in a 2–5% solution of an alkaline metal hydroxide at from about 20° C. to about 80° C., preferably from about 20° C. to about 60° C. Subsequently, the original thin copper layer is etched where exposed with an etchant which does not harm the polymeric film, e.g., Perma-etch®, available from Electrochemicals, Inc. The final circuits have copper circuitry on one side, and diamond-like coating on polyimide surface on the opposing side, and any diamond-like carbon layers deposited between internal layers or on individual features.

Next come converting and auditing steps where the substrate is cut into smaller strips.

In an alternate additive process which is preferable where very hard diamond-like carbon coatings are used, and there is a propensity for cracking during early lamination and sputtering steps, the diamond-like carbon may be deposited on the polyimide side of the substrate after the flash copper plating step, with the remaining steps of the process being as described above.

In an alternate type of process called a substractive process, polyimide film is sputtered with a seed layer of chrome and copper. The aqueous processible photoresists are laminated onto both sides of a substrate having a polymeric film side and a thick copper side, using standard laminating techniques. The substrate used in this process consists of a polymeric film layer about 12 micrometers to about 125 micrometers thick with the copper layer being from about 12 to about 40 micrometers thick (in the additive process, the copper layer is 1–5 micrometers thick).

The photoresist is then exposed on both sides to ultraviolet light or the like, through a suitable mask, crosslinking the exposed portions of the resist. The image is then developed with a dilute aqueous solution until desired patterns are obtained on both sides of the laminate. The thick copper layer is then etched to obtain circuitry, and portions of the polymeric layer thus exposed.

The diamond-like carbon is then etched using oxygen plasma or other comparable processes to expose the polyimide surface.

An additional layer of aqueous photoresist is then laminated over the first resist on the copper side and crosslinked by flood exposure to a radiation source in order to protect exposed polymeric film surface (on the copper side) from further etching. Areas of the polymeric film (on the film side) not covered by the crosslinked resist are then etched with the concentrated base at a temperature of from about 70° C. to about 120° C., and the photoresists are then stripped from both sides with a dilute basic solution. Next come converting and auditing steps.

As with the additive process, the diamond-like carbon layer may be coated after initial laminating and sputtering steps are completed, with other processes remaining the steps.

The previous methods coat the conformal diamond-like carbon layer over the entire substrate. In the selective coating processes, the layer is coated only in areas of the polyimide surface where protection is desired. These processes are typically completed postcircuitization. One selective process is a mechanical masking process wherein the diamond-like carbon layer is coated through an appropriate mask after flash etching and converting step.

Other steps may also be included in these processes, such as soaking the film in hot water before or after the etching bath, rinse steps and the like. Acid baths may also be used as a post-etching neutralization, web cleaning steps may follow plating steps.

To create finished flexible circuits, interconnect bonding tape for "TAB" (tape automated bonding) processes, microflex circuits, and the like, further layers may be added and processed, the copper plating may be plated with gold, tin, or nickel for subsequent soldering procedures and the like according to conventional means. When using a selective coating process such as the mechanical masking process, the diamond-like carbon layer may also be coated after this final plating step.

Means for interconnection of the flexible circuit to the printed circuit board or other device may be selected from any conventional means, connecting the pads or other connection points including solder balls, reflow solder, thermal compression bonding, wire bonding, inner lead bonding and the like.

Flexible circuits formed from carriers and processes of the invention are useful in electronic packages such as ball grid arrays, chip scale packages, single and multiple metal layer packages and the like. Such circuits and packages can be designed for use in any electronic device, including but not limited to recording devices, printing devices, single or multimedia devices, projectors, cameras, computers, data storage devices and the like.

The following examples are meant to be illustrative and are not intended to limit the scope of the invention which is expressed solely by the claims.

EXAMPLES

Example 1

Diamond-like carbon films were continuously deposited on a 50 micron Kapton ® web by the process described herein. In this process, the polyimide web was wrapped around a chilled drum (15.24 cm diameter×15.24 cm long) to which radio frequency (rf) power (at 13.56 Mhz frequency) was supplied. The rf power serves ti initiate and sustain a plasma of a hydrocarbon gas (butadiene) utilized to deposit diamond-like carbon films at a pressure of about 10 mTorr. A steady-state DC self-bias voltage appears on the substrate web wrapped around the drum, the magnitude of which is about 1000 V. A series of samples was prepared under the following conditions of deposition:

| Butadiene flow rate, sccm | Pressure, motor | Power, watts | Web Speed, cm/min | Estimated diamond-like carbon thickness |
|---|---|---|---|---|
| 60 | 9.5 | 600 | 64 | 1200 |
| 180 | 9.5 | 600 | 190.5 | 1200 |
| 60 | 9.5 | 1000 | 64 | 1200 |
| 180 | 9.5 | 1000 | 190.5 | 1200 |
| 60 | 9.5 | 600 | 27 | 2800 |
| 180 | 9.5 | 600 | 82.3 | 2800 |
| 60 | 9.5 | 1000 | 27 | 2800 |
| 180 | 9.5 | 1000 | 82.3 | 2800 |
| 120 | 9.5 | 800 | 75 | 2000 |
| 120 | 9.5 | 800 | 75 | 2000 |
| 120 | 9.5 | 800 | 75 | 2000 |
| 120 | 9.5 | 800 | 75 | 2000 |

Deposition of the diamond-like carbon layer under the above conditions was performed on a single roll of polyimide film. Approximately 6.1 m of 15.24 cm (6-inch) wide polyimide film was coated for each of the conditions above. The diamond-like carbon coated polyimide film was then sputter coated.

Example 2

Diamond-like Carbon on Copper Plated Circuit Web (Selective Diamond-like Carbon Deposition, Post Circuitization, Pre-Gold Plating)

Diamond-like carbon films were deposited continuously over a moving web by the process described above. The web was a 48 mm wide circuit web having the metal circuit lines. In a post-circuitization process, depositing the diamond-like carbon film prior to gold-plating is desirable if there exists an inherent yield inefficiency in the diamond-like carbon process. Selective deposition was achieved by first wrapping the circuit web over the rf-powered drum and subsequently wrapping the drum with a second web called the masking web. The masking web is a polyester web containing rectangular holes to permit diamond-like carbon deposition to occur on the circuit web only in the rectangular openings. The circuit and masking webs are registered with respect to each other by the engagement of their sprocket holes with sprocket teeth located on the rf powered drum. Diamond-like carbon films were deposited by decomposing trans 2-butene gas with rf power (from a 13.56 Mhz generator). Prior to deposition, the circuit web was cleaned in an argon plasma. The process conditions are as follows:

| Argon Plasma Precleaning: | |
| --- | --- |
| Argon Flow Rate: | 110 sccm |
| Pressure: | 30 mTorr |
| Power: | 500 Watts |
| Web Speed: | 3 m/min |
| Diamond-like Carbon Deposition: | |
| trans 2-Butene Flow Rate: | 200 sccm |
| Pressure: | 100 mTorr |
| Power: | 500 Watts |
| Web Speed: | 2.1 m/min |

Approximately 82 meters of circuit web was coated in the above run which produced diamond-like carbon films selectively over a portion of the circuit within a placement tolerance of 125 microns. The resulting diamond-like carbon film thickness is estimated to be 1300 Angstroms.

Example 3

Diamond-like Carbon on Gold-Plated Circuit Web
(Selective Diamond-like Carbon Deposition, Post-Circuitization, Post Gold Plating)

Diamond-like carbon films were deposited on 48 mm wide circuit web in which copper plating of circuit lines was followed by gold plating. The diamond-like carbon deposition process was similar to Example 2. The DLC films were selectively deposited through a masking film in two steps, argon plasma precleaning followed by diamond-like carbon deposition as follows:

| Argon Plasma Precleaning: | |
| --- | --- |
| Argon Flow Rate: | 110 sccm |
| Pressure: | 40 mTorr |
| Power: | 500 Watts |
| Web Speed: | 3 m/min |
| Diamond-like carbon Deposition: | |
| trans 2-Butene Flow Rate: | 685 sccm |
| Pressure: | 107 mTorr |
| Power: | 500 Watts |
| Web Speed: | 2.4 m/min |

Approximately 106 m of circuit web was coated in the above run which produced diamond-like carbon films selectively over portions of the circuit with a placement tolerance of 1.5 mm. The resulting diamond-like carbon film thickness is estimated to be 1100 Angstroms.

What is claimed is:

1. A flexible printed circuit comprising:
   a) at least one layer of polymer dielectric material,
   b) at least one layer of electrically conductive material thereover, and
   c) at least one circuit trace,
   each of said dielectric layers and each of said conductive layers having two major surfaces, at least one layer selected from a dielectric layer or a conductive layer having at least one aperture therein,
   wherein at least one of said dielectric layers has a material selected from the group consisting of diamond-like carbon, hydrogenated diamond-like carbon, functionalized diamond-like carbon, silicone nitride, boron nitride, silicon carbide, silicon dioxide and boron trifluoride coated on at least a portion of at least one major surface of said dielectric layers, said material having a Young's Modulus of from about 100 to about 200 GPa, a dielectric constant between 45 MHz and 20 GHz of from about 8 to about 12, and a Vickers hardness of from about 2000 to about 9000 kg/mm$^2$.

2. A flexible circuit according to claim 1 wherein said material has a thickness of between about 500 Angstroms to about 3000 Angstroms.

3. A flexible circuit according to claim 1 wherein said material is selected from diamond-like carbon and hydrogenated diamond-like carbon.

4. A flexible circuit according to claim 1 wherein said layer of material is a covercoat deposited as an uppermost layer.

5. A flexible circuit according to claim 1, comprising:
   a) a polymeric dielectric material having two major surfaces,
   b) a layer of diamond-like carbon on at least a portion of at least one major surface of said dielectric material,
   c) a first layer of metal atop said layer of diamond-like carbon layer, and
   d) a second layer of metal electroplated onto said first layer.

6. A flexible circuit according to claim 5 wherein said layer of material is deposited as an uppermost covercoat layer.

7. A flexible circuit according to claim 1 comprising:
   a) a polymeric dielectric material having two major surfaces,
   b) a layer of non-metallic material on at least a portion of at least one major surface of said dielectric material, said non-metallic material having a Vickers hardness greater than 2000 and a dielectric constant between 45 MHz and 20 GHz greater than 8,
   a first layer of metal on said non-metallic layer, and
   a second layer of metal electroplated onto said first layer.

8. A flexible circuit comprising
   a) at least one layer of polymer dielectric material,
   b) at least one layer of electrically conductive material thereover, and
   c) at least one circuit trace,
   each of said dielectric layers and each of said conductive layers having two major surfaces, at least one layer selected from a dielectric layer or a conductive layer having at least one aperture therein,
   wherein at least one of said dielectric layers has a material coated on at least a portion of at least one major surface of said dielectric layers, said material having a Young's Modulus of from about 100 to about 200 GPa, a dielectric constant between 45 MHz and 20 GHz of from about 8 to about 12, and a Vickers hardness of from about 2000 to about 9000 kg/mm$^2$, wherein said material is diamond-like carbon wherein said diamond-like carbon has a functionalized surface.

9. A flexible circuit according to claim 8 wherein said surface of said diamond-like carbon is functionalized with an element selected from the group consisting of silicon, oxygen, nitrogen, sulfur, titanium, chromium, copper, fluorine and nickel.

10. A flexible circuit according to claim 8 wherein said functionalized diamond-like carbon is functionalized hydrogenated diamond-like carbon.

11. A flexible circuit comprising:
a) at least one layer of polymer dielectric material,
b) at least one layer of electrically conductive material thereover, said polymer dielectric layer and said electrically conductive layer having two major surfaces, said polymer dielectric layer having a circuit trace, and at least one feature selected from an aperture, a stiffener, and a groundplane, said feature having a at least a portion thereof coated diamond-like carbon with a material having a Young's Modulus of from about 100 to about 200 GPa, a dielectric constant between 45 MHz and 20 GHz of from about 8 to about 12, and a Vickers hardness of from about 2000 to about 9000 kg/mm$^2$.

12. A flexible circuit according to claim 11 wherein said feature is a blind via, said blind via having an interior and a base, at least one of which is coated with said diamond-like carbon material.

13. A flexible circuit according to claim 11 wherein said diamond-like carbon material is hydrogenated diamond-like carbon.

14. A flexible circuit according to claim 11 further comprising at least one additional layer of dielectric material.

* * * * *

UNITED STATES PATENT AND TRADEMARK OFFICE
CERTIFICATE OF CORRECTION

PATENT NO. : 6,071,597
DATED : June 6, 2000
INVENTOR(S) : Rui Yang, Thach G. Truong, Justine A. Mooney & Moses M. David It is certified that error appears in the above-identified patent and that said Letters Patent is hereby corrected as shown below:

Title page,
FOREIGN PATENT DOCUMENTS, "0064343A2" should read -- 0664343A2 --.

Column 4,
Line 55, the third occurrence of "layer" should read -- laser --.

Column 6,
Line 56, "coated" should read -- coating --.

Column 16,
Line 1, "density" should read -- densify --.

Column 20,
Line 41, delete "said" and insert -- an additional --.
Line 41, after "layer" insert -- diamond-like carbon --.

Signed and Sealed this

Twentieth Day of November, 2001

Attest:

*Nicholas P. Godici*

NICHOLAS P. GODICI
*Attesting Officer*  *Acting Director of the United States Patent and Trademark Office*